(12) United States Patent
Kramer

(10) Patent No.: US 6,958,611 B1
(45) Date of Patent: Oct. 25, 2005

(54) DIAGNOSTIC REMOTE CONTROL FOR ELECTRICAL COMPONENTS ON VEHICLE

(75) Inventor: Dennis A. Kramer, Troy, MI (US)

(73) Assignee: Meritor Heavy Vehicle Systems, LLC, Troy, MI (US)

( * ) Notice: Subject to any disclaimer, the term of this patent is extended or adjusted under 35 U.S.C. 154(b) by 548 days.

(21) Appl. No.: 09/411,730

(22) Filed: Oct. 1, 1999

(51) Int. Cl.$^7$ .................. G01R 31/00; G01R 31/08
(52) U.S. Cl. .................. 324/504; 324/523; 324/414
(58) Field of Search ................. 324/503, 504; 701/29, 35, 36; 307/10.2; 340/825.69, 539, 340/825.72

(56) References Cited

U.S. PATENT DOCUMENTS

| | | | | |
|---|---|---|---|---|
| 3,663,939 A | * | 5/1972 | Olsson | 320/107 |
| 4,021,730 A | * | 5/1977 | Brinegar | 324/523 |
| 4,586,370 A | * | 5/1986 | Massender | 73/121 |
| 4,866,390 A | * | 9/1989 | Butchko | 324/504 |
| 4,884,032 A | * | 11/1989 | LaPensee | 324/504 |
| 5,025,253 A | * | 6/1991 | DiLullo et al. | 340/10.41 |
| 5,086,277 A | * | 2/1992 | Hammerly | 324/504 |
| 5,095,276 A | * | 3/1992 | Nepil | 324/504 |
| 5,142,278 A | * | 8/1992 | Moallemi et al. | 340/436 |
| 5,192,912 A | * | 3/1993 | Lemon | 324/504 |
| 5,311,138 A | * | 5/1994 | Ott et al. | 324/503 |
| 5,416,421 A | * | 5/1995 | Doland, Sr. et al. | 324/556 |
| 5,442,553 A | * | 8/1995 | Parrillo | 455/420 |
| 5,500,637 A | * | 3/1996 | Kokubu | 340/447 |
| 5,583,479 A | * | 12/1996 | Hettich et al. | 340/426 |
| 5,602,482 A | * | 2/1997 | Gutierrez | 324/504 |
| 5,604,439 A | * | 2/1997 | Walkington et al. | 324/504 |
| 5,619,412 A | * | 4/1997 | Hapka | 701/36 |
| 5,635,843 A | * | 6/1997 | Borland | 324/504 |
| 5,640,139 A | * | 6/1997 | Egeberg | 340/426 |
| 5,650,774 A | * | 7/1997 | Drori | 340/5.22 |
| 5,684,337 A | * | 11/1997 | Wallace | 307/10.2 |
| 5,693,876 A | * | 12/1997 | Ghitea, Jr. et al. | 73/114 |
| 5,745,033 A | * | 4/1998 | Jenkins, Jr. et al. | 340/539 |
| 5,748,669 A | * | 5/1998 | Yada | 375/202 |
| 5,798,576 A | * | 8/1998 | Ostermann et al. | 307/10.3 |
| 5,848,365 A | * | 12/1998 | Coverdill | 701/35 |
| 5,850,188 A | * | 12/1998 | Doyle et al. | 340/825.69 |
| 5,890,080 A | * | 3/1999 | Coverdill et al. | 701/29 |
| 5,957,986 A | * | 9/1999 | Coverdill | 701/35 |
| 6,066,951 A | * | 5/2000 | Maass | 324/414 |
| 6,112,138 A | * | 8/2000 | Dannenberg | 701/1 |
| 6,138,065 A | * | 10/2000 | Kramer | 701/29 |
| 6,265,878 B1 | * | 7/2001 | Traub | 324/504 |

FOREIGN PATENT DOCUMENTS

| | | | | |
|---|---|---|---|---|
| DE | WO-92/15761 | * | 9/1992 | E05B 49/00 |
| DE | 4334859 A1 | | 12/1994 | |
| EP | 0754940 A2 | | 6/1996 | |
| EP | 0895198 A2 | | 7/1998 | |
| EP | 0685723 A3 | | 9/1998 | |
| EP | 0887497 A2 | | 12/1998 | |
| GB | 2263376 A | | 7/1993 | |
| WO | WO 90/09645 A1 | | 8/1990 | |

\* cited by examiner

*Primary Examiner*—Andrew H. Hirshfeld
*Assistant Examiner*—Wasseem H. Hamdan
(74) *Attorney, Agent, or Firm*—Carlson, Gaskey & Olds

(57) ABSTRACT

A method of actuating electrical components of a vehicle, such as a heavy duty truck, for performing diagnostic analysis on the electrical components on the truck without the assistance of a technician is disclosed. The method includes relaying a signal from a remote transmitter to a receiver aboard a vehicle and actuating electrical components on the vehicle in response to the signal from the transmitter.

8 Claims, 1 Drawing Sheet

US 6,958,611 B1

DIAGNOSTIC REMOTE CONTROL FOR ELECTRICAL COMPONENTS ON VEHICLE

BACKGROUND OF THE INVENTION

The invention relates to a method for performing diagnostic analysis on electrical components of a vehicle. More specifically, the invention relates to a method for actuating the electrical components of a vehicle for performing the diagnostic analysis.

Heavy duty vehicles require frequent maintenance checks on electrical components such as, for example, brakes, differentials, ABS valves, turn signal lamps, brake lamps, and any component having an electrically actuated input. Occasionally, these checks need to be performed by the vehicle operator while the vehicle is in the field. These maintenance checks require that the electrical components be actuated while performing diagnostic analysis on the components. Additionally, diagnostic analysis of these components requires visually inspecting the components while the components are being actuated.

Currently, the method for actuating the electrical components requires two technicians. A first technician sits in the vehicle cab and actuates the components upon the verbal commands of a second technician that is outside the cab visually inspecting the components. The inability to remotely actuate the electrical components for performing diagnostic analysis prevents a single technician from performing the analysis. Additionally, a single operator is not able to conduct a maintenance check while alone in the field.

Therefore, a need exists for a method of actuating vehicle electrical components for performing diagnostic analysis on the components while outside the vehicle cab. This would enable a single technician, or even a single operator to perform maintenance checks on the vehicle electrical components.

SUMMARY OF THE INVENTION AND ADVANTAGES

As disclosed in the embodiment of this invention, a method of actuating electrical components of a vehicle for performing diagnostic analysis on the electrical components includes relaying a signal from a remote transmitter to a receiver aboard a vehicle, and actuating electrical components on the vehicle in response to the signal from the remote transmitter.

Actuating the electrical components on a vehicle with a remote transmitter allows a single technician to perform visual diagnostic analysis on the electrical components without the assistance of a second technician. Therefore, the technician can actuate the electrical components with the remote transmitter while walking around the vehicle and inspecting the components. By eliminating the second technician the efficiency of performing maintenance checks is improved.

In addition, a vehicle operator can use the remote transmitter to perform diagnostic analysis on the electrical components while alone in the field. This allows the operator to verify that electrical components such as, for example, the brake lights are functioning properly without needing assistance from another person.

BRIEF DESCRIPTION OF THE DRAWINGS

Other advantages of the present invention will be readily appreciated as the same becomes better understood by reference to the following detailed description when considered in connection with the accompanying drawings wherein.

DETAILED DESCRIPTION OF THE PREFERRED EMBODIMENT

Figure 1:
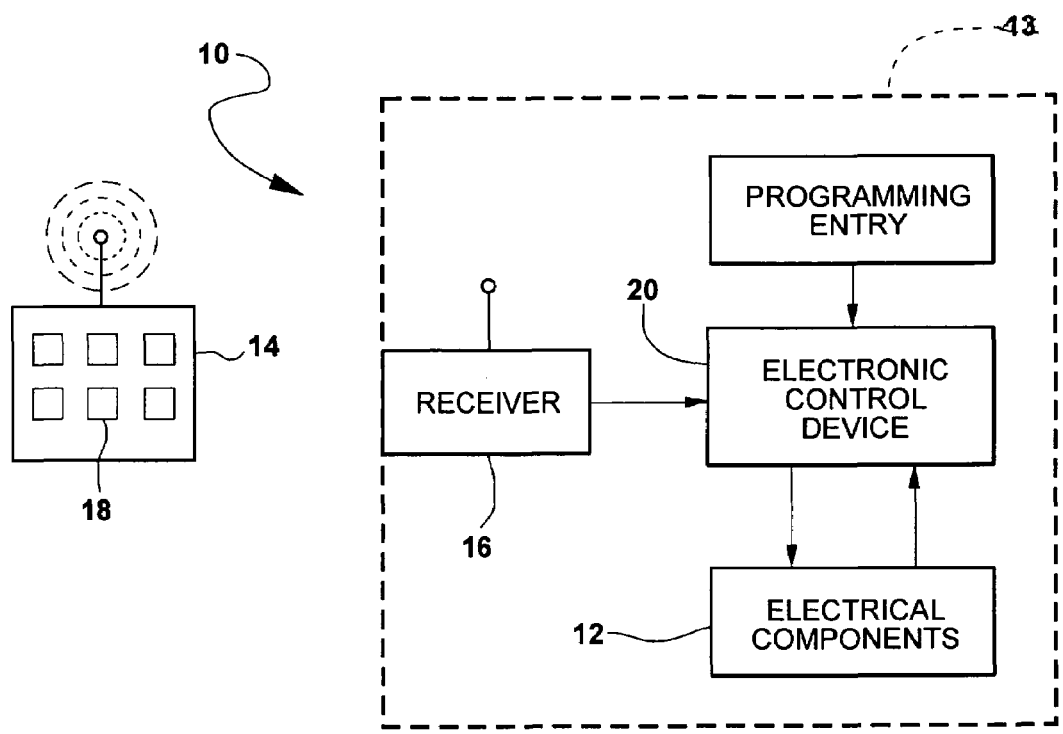
FIG. 1 is a schematic of the present invention showing an electronic control device.

Referring to FIG. 1, a schematic is generally shown at 10 for a method of actuating electrical components 12 of a vehicle 13 for performing diagnostic analysis on the electrical components 12. A heavy duty truck that is designed to pull cargo trailers or the like requires frequent diagnostic analysis of onboard electrical components 12 such as, for example, brakes, differentials, ABS valves, turn signal lamps, and brake lamps. It is desirable for a single technician to both actuate and view the electrical components 12 that are being actuated. Therefore, the method includes relaying a signal from a remote transmitter 14, which is preferably hand held, to a receiver 16 aboard the vehicle and actuating electrical components 12 on the vehicle in response to the signal from the transmitter 14.

The method further includes the step of performing diagnostic analysis upon the electrical components 12 of the vehicle while actuating the electrical components 12 with the remote transmitter 14. The remote control transmitter 14 allows the technician to walk around the vehicle and actuate electronic components 12 when desired upon depressing buttons 18 on the transmitter 14. The transmitter 14 can include several buttons 18, one for each electrical component, or alternatively, only one button 18 that actuates some of, or all of the components 12 simultaneously.

The step of relaying a signal from the remote transmitter 14 is further defined by transmitting a radio frequency signal from the remote transmitter 14 to the vehicle receiver 16. The range of radio frequency transmission can be proximately limited to the location of the vehicle similar to the range of a remote keyless entry transmitter. In fact, the transmitter 14 and the receiver 16 can be similar to those used for remote keyless entry systems that are widely used in the light vehicle industry.

The method of actuating electrical components 12 of a vehicle for performing diagnostic analysis can be performed at an assembly plant by an original equipment manufacturer, or at a maintenance facility by a technician. The method can also be performed by a vehicle operator while in the field without the assistance of another individual. While intended for use on heavy duty vehicles, the method can also be performed on light vehicles such as passenger cars and pickup trucks.

The method further includes the step of relaying the signal received by the receiver 16 to an electronic control device 20 located aboard the vehicle. Modern heavy duty vehicles include an on board electronic control device 20 programmed to operate the vehicle's electrical components 12 during operation of the truck. The control device 20 operates the engine, the transmission, and most of the electrical components aboard the vehicle.

The step of actuating the electrical components 12 is further defined by directing the electronic components 12 through an actuation cycle programmed into the electronic control device 20. The control device 20 communicates with vehicle electrical components 12, such as though 11708/11587 data bus devices as is known in the art of electronic vehicle control. Therefore, the data bus devices can also be used for relaying the actuation cycle from the control device 20 to the electrical components 12. The program is activated by the signal relayed by the receiver 16 and directs the electrical components 12 through the actuation cycle. The cycle can include the actuation of several components 12, or of a single component.

A temporary program directing the actuation cycle can be entered into the electronic control device 20. The program can be erased subsequent to the diagnostic evaluation of the electrical components 12. Alternatively, other ways of achieving the required actuation can be inserted into the inventive system.

Figure 2:
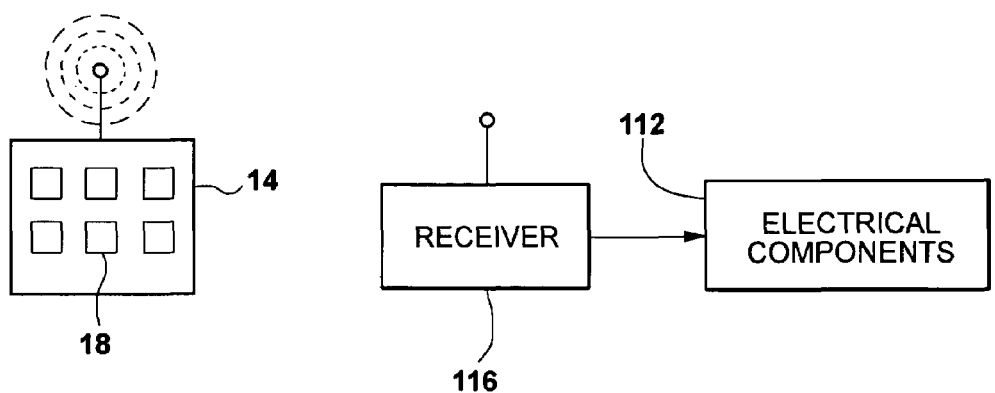
FIG. 2 is an alternative embodiment of the present invention bypassing the electronic control device.

An alternative embodiment, as shown in FIG. 2, includes the step of wiring the receiver 116 to the electrical components 112 for bypassing the electronic control device 20 and directly signaling the electrical components 112. Therefore, the relay to the electrical components 112 would be directly from the receiver 116, and the J1708/J1587 data bus devices would be bypassed. Accordingly, the actuation of the electrical components would be a simple power/no power operation. Again, the appropriate program to achieve the actuation, etc. would be within the skill level in this art.

An additional embodiment defines the step of relaying a signal from the remote transmitter 14 by transmitting a radio frequency signal from a remote transmitter 14 to a keyless entry receiver 16. The need for installing a designated receiver 16 for performing diagnostics is eliminated by transmitting the radio frequency signal to the keyless entry receiver 16. The keyless entry receiver 16 can be either wired to the control device 20, for relaying the signal to the control device 20, or can be wired directly to the electrical components 12, for bypassing the control device 20.

Therefore, the method can include the step of relaying the signal received by the keyless entry receiver 16 to the electronic control device 20 located aboard the vehicle. Alternatively, the method can include the step of wiring the keyless entry receiver 16 to the electrical components 12 for bypassing the electronic control device 20 for directly signaling the electrical components 12.

The invention has been described in an illustrative manner, and it is to be understood that the terminology which has been used is intended to be in the nature of words of description rather than of limitation.

Obviously, many modifications and variations of the present invention are possible in light of the above teachings. It is, therefore, to be understood that within the scope of the appended claims, wherein reference numerals are merely for convenience and are not to be in any way limiting, the invention may be practiced otherwise than as specifically described.

What is claimed is:

1. A method of actuating electrical components of a vehicle for performing diagnostic analysis on the electrical components, said method comprising:

relaying a signal from a remote transmitter to a keyless entry receiver aboard a vehicle by transmitting a radio frequency signal from the remote transmitter to the keyless entry receiver;

relaying the signal received by the keyless entry receiver to an electronic control device located aboard the vehicle; and actuating a plurality of electrical components on the vehicle in response to the signal from the remote transmitter by directing the electronic components through an actuation cycle programmed into the electronic control device to allow visual inspection of the actuation of said plurality of electrical components from the location of said remote transmitter and diagnostic analysis of the plurality of electrical components on the vehicle.

2. A method as set forth in claim 1, wherein said plurality of electrical components includes at least a brake and at least a plurality of lights.

3. A method of actuating electrical components of a vehicle for performing diagnostic analysis on the electrical components, said method comprising:

an electronic control device on the vehicle with an actuation cycle for a plurality of vehicle electrical components;

receiving a radio frequency signal from a remote transmitter in a keyless entry receiver aboard the vehicle; and relaying the signal received by the keyless entry receiver to the electronic control device for beginning the actuation cycle of the plurality of electrical components in response to the signal from the transmitter to allow diagnostic analysis to be performed upon the plurality of electrical components while actuating the plurality of electrical components with the remote transmitter.

4. A method as set forth in claim 3, wherein said step of storing the electronic control device comprises saving a temporary program into the electronic control device for actuating the plurality of electrical components.

5. A method as set forth in claim 3 wherein the remote transmitter is disposed outside the vehicle to allow the diagnostic analysis to be executable outside the vehicle.

6. An apparatus for performing diagnostic analysis upon electronic components of a vehicle, wherein said apparatus comprises:

a remote transmitter for transmitting an actuation signal;

a keyless entry receiver located aboard a vehicle for receiving the actuation signal from said remote transmitter;

an electronic control device in communication with the keyless entry receiver, wherein the keyless entry receiver relays the actuation signal to the electronic control device and wherein the electronic control device controls a plurality of electrical components to be actuated for diagnostic purposes through an actuation cycle to allow visual inspection of the actuation of said plurality of electrical components from outside the vehicle.

7. An apparatus as set forth in claim 6, further comprising an electronic data bus, wherein the keyless entry receiver is connected to the electronic data bus to bypass the electronic control device and connect directly to the plurality of electrical components.

8. An apparatus as set forth in claim 6, wherein said plurality of electrical components includes at least a brake and at least a plurality of lights.

* * * * *

UNITED STATES PATENT AND TRADEMARK OFFICE
CERTIFICATE OF CORRECTION

PATENT NO. : 6,958,611 B1
DATED : October 25, 2005
INVENTOR(S) : Kramer

It is certified that error appears in the above-identified patent and that said Letters Patent is hereby corrected as shown below:

Column 4,
Line 16, insert -- storing -- before the first occurrence of "an".

Signed and Sealed this

Third Day of January, 2006

JON W. DUDAS
*Director of the United States Patent and Trademark Office*